United States Patent
Khan. P et al.

(10) Patent No.: US 7,298,181 B2
(45) Date of Patent: Nov. 20, 2007

(54) HIGHEST SUPPLY SELECTION CIRCUIT

(75) Inventors: Athar Ali Khan. P, Andhra Pradesh (IN); Rajiv Pandey, Madhya Pradesh (IN); Pradip Mandal, West Bengal (IN)

(73) Assignee: Pulsecore Semiconductor Corp., Campbell, CA (US)

( * ) Notice: Subject to any disclaimer, the term of this patent is extended or adjusted under 35 U.S.C. 154(b) by 0 days.

(21) Appl. No.: 11/296,777

(22) Filed: Dec. 6, 2005

(65) Prior Publication Data

US 2007/0126482 A1 Jun. 7, 2007

(51) Int. Cl.
*H03K 5/22* (2006.01)

(52) U.S. Cl. .......................... 327/70; 327/63; 327/407; 327/408

(58) Field of Classification Search .................. 327/63, 327/70, 82, 310, 333, 408; 326/80–83
See application file for complete search history.

(56) References Cited

U.S. PATENT DOCUMENTS

| | | | |
|---|---|---|---|
| 5,841,314 A * | 11/1998 | Brigati et al. | 327/536 |
| RE36,179 E * | 4/1999 | Shimoda | 327/407 |
| 6,281,724 B1 * | 8/2001 | Ellis | 327/143 |
| 6,359,497 B1 * | 3/2002 | Criscione | 327/408 |
| 7,129,600 B2 * | 10/2006 | Wu et al. | 307/80 |

* cited by examiner

*Primary Examiner*—Tuan T. Lam
*Assistant Examiner*—William Hernandez
(74) *Attorney, Agent, or Firm*—Harris Zimmerman

(57) ABSTRACT

A power supply monitoring circuit that monitors and delivers the highest voltage power supply to an IC system includes a voltage comparator that receives two different power supply voltages, and outputs a first signal to the gate of a first switching transistor connected between a first power supply and an system power supply output node. The comparator output is also input to an inverter, the output of which comprises a second signal connected to the gate of a second switching transistor connected between a second power supply and the system power supply output node. When the first supply voltage exceeds the second supply voltage, the first transistor is switched on to connect the first supply to the system output node, and the second transistor is switched off; and vice versa. The comparator includes designed-in hysteresis to prevent simultaneous switching of the two transistors.

6 Claims, 3 Drawing Sheets

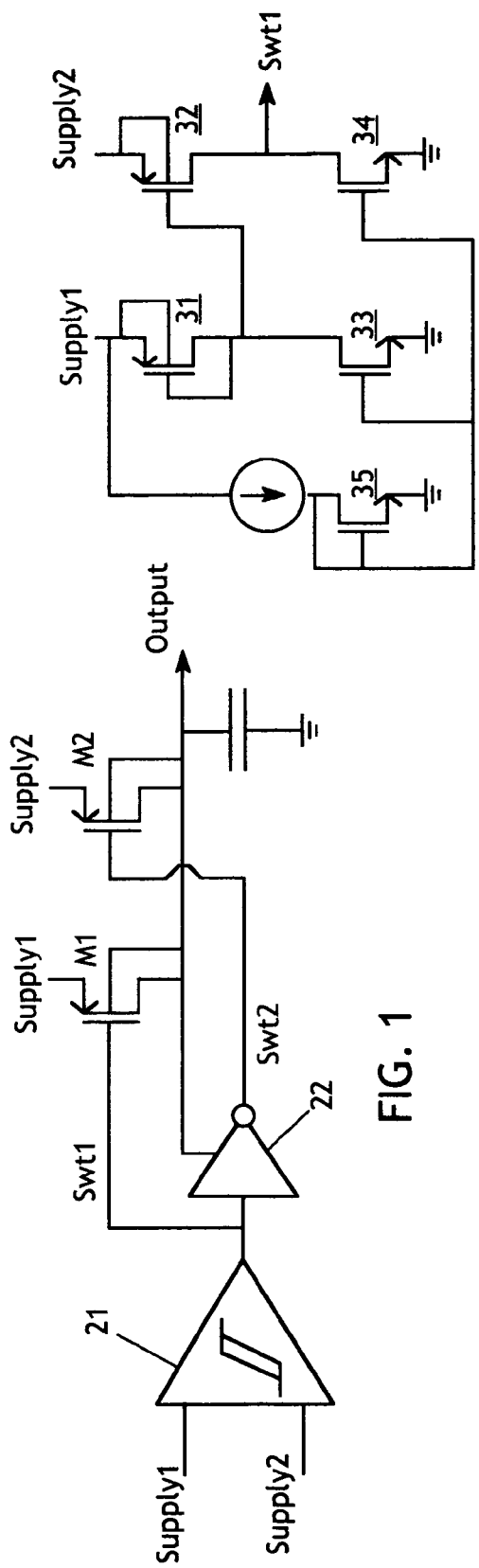
FIG. 1
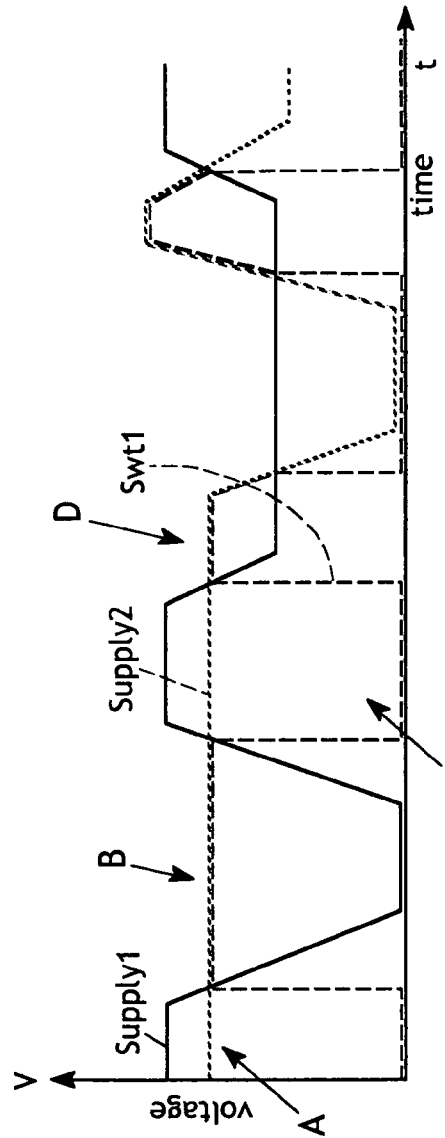
FIG. 2
FIG. 3

HIGHEST SUPPLY SELECTION CIRCUIT

CROSS-REFERENCE TO RELATED APPLICATIONS

Not applicable.

FEDERALLY SPONSORED RESEARCH

Not applicable.

SEQUENCE LISTING, ETC ON CD

Not applicable.

BACKGROUND OF THE INVENTION

1. Field of the Invention

This invention relates to integrated circuit power supply systems and, more particularly to supply systems that deliver more than one supply voltage.

2. Description of Related Art

In integrated circuit systems, development of CMOS process technology has allowed for higher component density and more device speed with lower power consumption. Reduction of power consumption is achieved mainly by using a lower supply voltage. However, diverse evolutionary paths of different modules (which are implemented as different integrated circuit) result in circuits with dissimilar requirements and characteristics. Some core ICs, like microprocessors, memory etc., are primarily implemented in sub-micron process to exploit technological advances while some peripheral modules are still fabricated in micron process due to cost reason. As a result, multiple supply lines are required to power various modules within a system. In such a multi-supply system, use of power management modules and power sequencers become critical to synchronize and monitor the different supply lines and hence, to avoid possible malfunction.

Within a power management (or supervisor) IC, a maximum supply selector circuit is a typical requirement. The maximum supply selector circuit provides power to the logic circuits of the power management IC even with presence of potential at only one supply line. To reduce the area of the power supervisor IC, some circuits can be shared for both the power supply monitoring paths. Bias, reference generator and all the internal digital logic circuits can be shared. The output buffers which generate the reset pulses and the supply monitoring potential dividers must have their respective voltage supplies. The power supply for the shared circuits should be the maximum of the two main supplies. A typical technique for implementing this requirement is to connect each power supply to the anode of a respective Schottky diode, the cathodes being connected to a supply output node. Thus the output voltage is the maximum of the two power supplies, minus the forward voltage drop of approx. 0.3 vdc.

However, in some IC manufacturing processes, it is difficult or not feasible to form Schottky diodes. And, for a low voltage power supply, the diode forward voltage drop may constitute a significant fraction of the supply voltage, and leakage may comprise a threat to the charge of a battery supply. These circumstances in the prior art have created a need for a circuit to select the highest power supply for an IC system, without using Schottky diodes.

BRIEF SUMMARY OF THE INVENTION

The present invention generally comprises a power supply monitoring circuit that monitors and delivers the highest voltage power supply to an IC system. A salient aspect of the invention is that it does not rely on the use of Schottky diodes, and does not suffer the loss of the forward diode voltage drop of the Schottky devices. In addition, the monitoring circuit of the invention includes designed-in hysteresis in the switching branches that select the higher power supply, so that ambiguous states and lockup are prevented.

In its most fundamental aspects, the invention includes a voltage comparator that receives two different power supply voltages, and outputs a first signal to the gate of a first switching transistor that is connected between a first power supply and an system power supply output node. The voltage comparator output is also input to an inverter, the output of which comprises a second signal connected to the gate of a second switching transistor that is connected between a second power supply and the system power supply output node. When the first supply voltage exceeds the second supply voltage, the first transistor is turned on to connect the first supply to the system output node, and the second transistor is off. Likewise, when the second supply voltage exceeds the first supply voltage, the second transistor is turned on to connect the second supply to the system output node, and the first transistor is off.

It is possible and predictable that at some instances the voltage at the first supply is equal to (or very close to) the second supply. In this situation, ideally, either the first or second signals can be at 0V and, to avoid direct shorting between the two supply lines, the other one should be at max of the first or second supplies. However, the switching situation is ambiguous and, in reality, due to presence of noise at the supply lines and finite gain of the voltage comparator, there is an unacceptable chance of back and forth switching between the two lines. Additionally, if the comparator output is not at a defined logic level the inverter current can be unacceptably high. Therefore, to avoid this problem the invention in a further aspect introduces hysteresis in the supply comparator. Because of the designed hysteresis, the first and second signals will maintain their previous levels until the difference between the two supply voltages exceeds a predetermined amount.

BRIEF DESCRIPTION OF THE DRAWING

FIG. 1 is a simplified schematic representation of the highest supply selector circuit of the invention.

FIG. 2 is a schematic representation of a power supply voltage comparator circuit that lacks hysteresis in its switching characteristic.

FIG. 3 is a graphic representation of the switching characteristics of the circuit shown in FIG. 2.

DETAILED DESCRIPTION OF THE INVENTION

Figure 4:
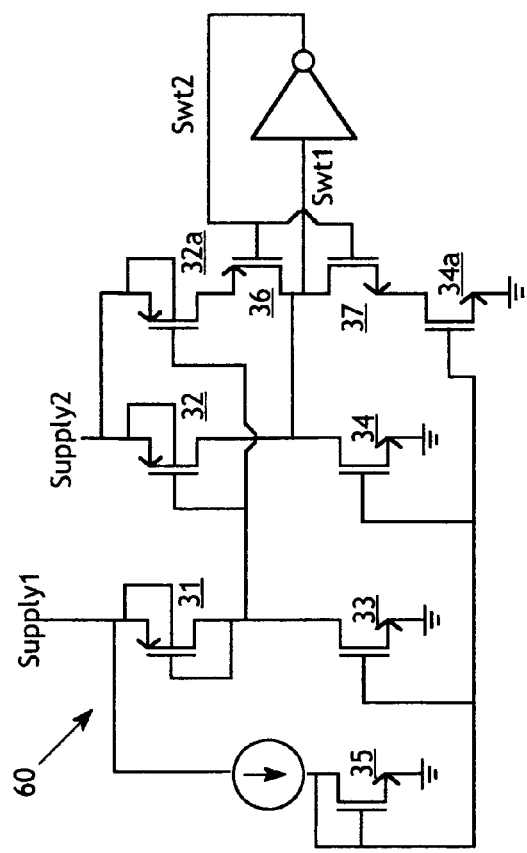
FIG. 4 is a schematic representation of a power supply voltage comparator circuit that incorporates hysteresis in its switching characteristic.

The present invention generally comprises a power supply monitoring circuit that monitors and selects the highest voltage power supply to an IC system. With regard to FIG. 1, the invention includes a voltage comparator 21 that receives two different power supply voltages, and outputs a first signal Swt1 to the gate of a first switching transistor M1 that is connected between a first power supply and an system power supply output node. The voltage comparator output is also input to an inverter 22, the output of which comprises a second signal Swt2 connected to the gate of a second switching transistor M2 that is connected between a second power supply and the system power supply output node. When the first supply voltage exceeds the second supply voltage, transistor M1 is turned on to connect the first supply to the system output node, and transistor M2 is off by the inverted signal Swt2. Likewise, when the second supply voltage exceeds the first supply voltage, transistor M2 is turned on to connect the second supply to the system output node, and transistor M1 is off.

With regard to FIG. 2, the basic circuit topology of the supply voltage comparator 21 of the invention includes a first matched pair of MOS switching transistors 31 and 32, one having its source-drain connected to a first power supply (Supply1), and the other connected in similar fashion to a second power supply (Supply2). Another matched pair of MOS switching transistors 33 and 34 are each connected to the source-drain circuit of a respective one of transistors 31 and 32. The midpoint node of 31-33 is connected to the gate of 32, and the midpoint of 32-34 is the switching signal Swt1 referred to previously.

For a voltage at supply2 more than that at supply1, the magnitude of the gate-source voltage of 32 is more than that of 31. However, the drive strength of 34 is same as that of 33 and 31. Therefore, in this condition 32 pulls the signal Swt1 to "high" (very close to supply2). Similarly, when the voltage at supply2 is less than that at supply1, the drive strength of 32 becomes weaker than that of 34 and hence signal Swt1 goes to "low" level. The switching characteristics of this circuit are illustrated in FIG. 3. When voltage at supply2 is lower than that of supply1, Swt1 signal remains at 0V, as at regions A and C. Once potential at supply2 exceeds that of supply1 (region B, D) the signal Swt1 starts following the voltage at supply2 line. Near each switching region the finite slope of the characteristic indicates the finite gain of the comparator.

From the characteristics shown in FIG. 3, one may conclude that the selection of the highest voltage supply may involve an ambiguous switching situation when the two supplies are close to the same voltage. To overcome this difficulty, the invention further introduces a voltage supply comparator that intentionally adds hysteresis designed into the circuit to eliminate ambiguous switching. With regard to FIG. 4, this circuit 60 builds on the embodiment of FIG. 2 by adding transistors 32a and 34a in parallel to transistors 32 and 34, respectively, to dynamically increase their strength. In addition, transistors 36 and 37 are interposed between 32a and 34a. respectively.

Figure 5:
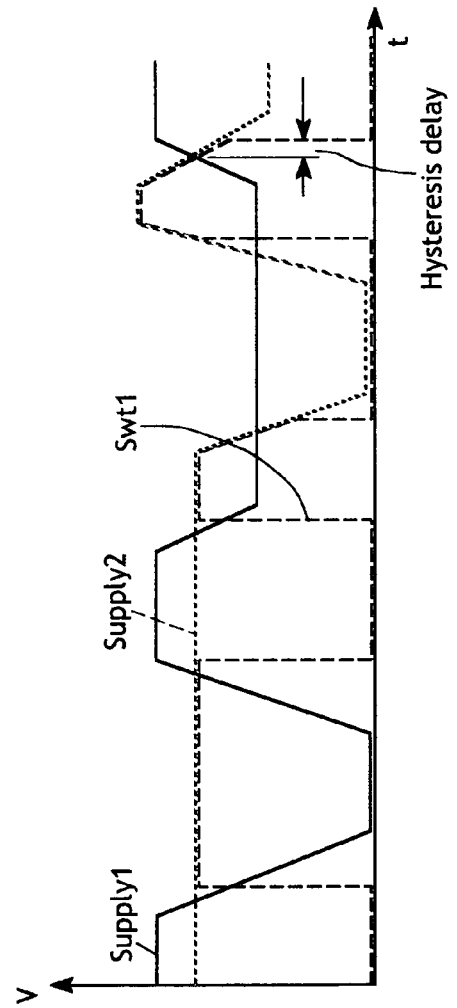
FIG. 5 is a graphic representation of the switching characteristics of the circuit shown in FIG. 4.

Transistor 36 works as a switch to connect/disconnect 32a in parallel with transistor 32, and transistor 37 works as a switch to connect/disconnect 34a in parallel with 34. Given an initial condition in which the voltage at supply1 is sufficiently higher than supply 2 so that Swt1 is low and Swt2 is high, then initially 34a is connected in parallel with 34 and 32a is disconnected. When voltage at supply2 is increasing and/or voltage at supply1 is decreasing, unlike the characteristic of circuit in FIG. 3, Swt1 does not go high with [(voltage at supply2)−(voltage at supply1)]=0V. Instead Swt1 goes high only when the voltage difference is sufficiently positive. Similarly, when [(voltage at supply2)−(voltage at supply1)] goes from positive to negative value, the characteristic switches only when the voltage difference is sufficiently negative. Switching characteristic and transient behavior of the hysteresis-comparator with simultaneous change of the two supply lines is shown in FIG. 5. Note the hysteresis delays in switching of Swt1 after the convergence of Supply1 and Supply2.

Figure 6:
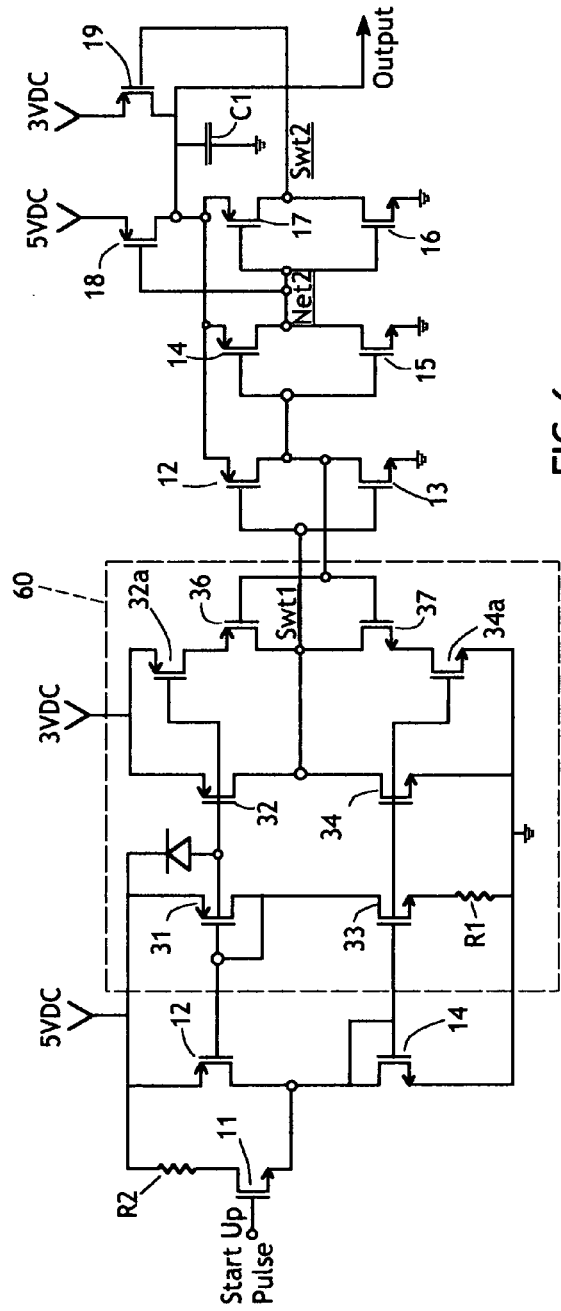
FIG. 6 is a schematic representation of the highest power supply selection circuit of the invention.

With regard to FIG. 6, there is depicted a complete circuit for sensing the highest voltage power supply and furthermore selecting it to drive a system. It includes the voltage comparator circuit 60 described previously, which is connected to a 5 vdc supply (supply1) and a 3 vdc supply (supply2). In addition, the 5 vdc supply is also connected through transistor 18 to the power output node, and the 3 vdc supply is connected through transistor 19 to the same output node. Thus transistors 18 and 19 may be operated to select the higher of the two power supplies. Capacitor C1 eliminates transient spikes in the switchover.

The output signal Swt1 of the circuit 60 is fed to an inverter stage formed by transistors 12 and 13. Two other inverter stages are formed by transistors 14-15, and transistors 16-17; all of these inverter stages are connected between the output node and ground and are connected in cascade fashion for the following effects. When the 5 vdc supply is greater than the 3 vdc supply, signal Swt1 will be driven low (logic zero), and signal Net2 is driven low, causing transistor 18 to switch on and connect the 5 vdc supply to the output. Likewise, the low state of signal Net2 switches on transistor 17, causing signal Swt2 to go high and cutting off transistor 19 and disconnecting the 3 vdc supply from the output. In the opposite case, when the 3 vdc supply is greater than the 5 vdc supply, signal Swt1 will be driven high (logic one), and signal Net2 is driven high, causing transistor 18 to switch off and disconnect the 5 vdc supply to the output. Likewise, the high level of signal Net2 turns off transistor 17 and causes signal Swt2 to go low, switching on transistor 19 and connecting the 3 vdc supply to the output. Simultaneous switching of the two transistors is avoided by the hysteresis circuit described above, whereby metastable states are eliminated. The circuit of FIG. 6 also includes a startup circuit formed by transistor 11 connected to an inverter stage formed by transistors 12 and 13.

Figure 7:
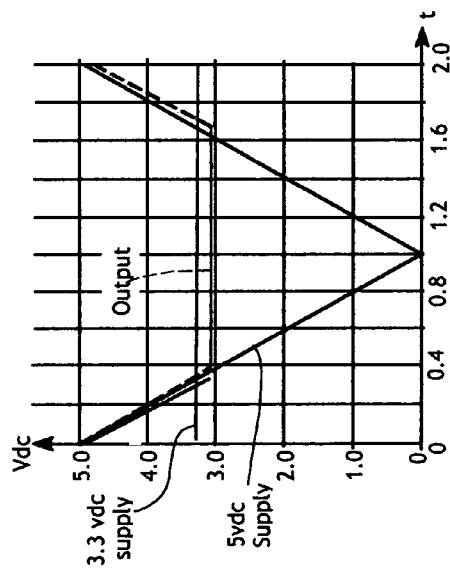
FIG. 7 is a graphic representation of the voltage output of the highest power supply selection circuit of FIG. 6.

With regard to FIG. 7, the output voltage of the circuit of FIG. 6 is depicted graphically. Assuming the lower voltage power supply is kept constant at 3.3 vdc while the higher voltage power supply is varied from 5 vdc to zero vdc, the output is initially at 5 vdc and tracks the falling supply. When the higher supply crosses below the 3.3 vdc level then the output switches (after a small hysteresis delay) and follows the constant 3.3 vdc level. Likewise when the 5 vdc supply increases from zero and crosses the 3.3 vdc level, the output switches (after a small hysteresis delay) and tracks the higher supply.

The complete circuit of FIG. 6 includes a large number of transistors, and appears to be much more extensive than a simple zener diode coupling known in the prior art. However, the area-consuming components of the circuit are primarily the two power switching transistors 18 and 19. The remaining devices occupy only 10% of the area of the two transistors 18 and 19, so that the complete circuit is compact and efficient. Thus the circuit of FIG. 6 is well-constructed for inclusion in an integrated circuit layout.

Although the invention is described with reference to the selection of the higher of two power supplies, it may be appreciated that it is easily adapted to track and select the highest supply from a plurality of power supplies. Also, there may be other circuit arrangements for introducing hysteresis into the switching characteristic of a circuit for detecting and selecting the power supply having the highest voltage among two or more supplies, and such other arrangements are considered to be included within the invention.

The foregoing description of the preferred embodiments of the invention has been presented for purposes of illustration and description. It is not intended to be exhaustive or to limit the invention to the precise form disclosed, and many modifications and variations are possible in light of the above teaching without deviating from the spirit and the scope of the invention. The embodiment described is selected to best explain the principles of the invention and its practical application to thereby enable others skilled in the art to best utilize the invention in various embodiments and with various modifications as suited to the particular purpose contemplated. It is intended that the scope of the invention be defined by the claims appended hereto.

The invention claimed is:

1. A power supply monitoring circuit for monitoring and delivering the highest voltage power supply to an IC system including:
    voltage comparator means having inputs connected to two different power supplies and generating a first signal fed to the gate of a first switching transistor connected between a first of said power supplies and an system power supply output node;
    inverter means connected to said first signal and outputting a second signal fed to the gate of a second switching transistor connected between a second of said power supplies and said system power supply output node;
    said voltage comparator means switching said first signal to a first state when said first supply voltage exceeds said second supply voltage to turn on said first transistor and connect the first supply to the system output node, and said second signal turns off the second transistor;
    said voltage comparator means switching said first signal to a second state when said second supply voltage exceeds said first supply voltage to turn off said first transistor and disconnect the first supply from the system output node, and said second signal turns on the second transistor to connect the second supply to the system output node;
    further including hysteresis means for delaying the switching of said first signal by said voltage comparator means;
    said voltage comparator means including a first pair of transistors having their source-drain circuits connected in series between said first power supply and ground;
    said voltage comparator means further including a second pair of transistors having their source-drain circuits connected between said second power supply and ground.

2. The power supply monitoring circuit of claim 1, wherein the midpoint node of said first pair of transistors is connected to the gate of one of said second pair of transistors.

3. The power supply monitoring circuit of claim 2, wherein said first signal comprises the voltage at the midpoint node of said second pair of transistors.

4. The power supply monitoring circuit of claim 3, wherein said hysteresis means includes a third pair of transistors having their source-drain circuits connected in series, and a fourth pair of transistors having their source-drain circuits connected in series between said second power supply, the source-drain connection of said third pair of transistors and ground.

5. The power supply monitoring circuit of claim 4, wherein said midpoint node of said first pair of transistors is connected to the gate of one of said fourth pair of transistors.

6. The power supply monitoring circuit of claim 5, wherein the midpoint node of the source-drain connection of said second pair of transistors is connected to the midpoint node of the source-drain connection of said third pair of transistors.

* * * * *